United States Patent [19]

Holman

[11] 4,071,396
[45] Jan. 31, 1978

[54] CONTROLLED ATMOSPHERE PROCESS FOR ALTERING THE NONSTOICHIOMETRY OF CRYSTALLINE MEMBERS

[75] Inventor: Robert L. Holman, Pittsford, N.Y.

[73] Assignee: Xerox Corporation, Stamford, Conn.

[21] Appl. No.: 730,891

[22] Filed: Oct. 8, 1976

[51] Int. Cl.$^2$ .............................................. G02B 5/14
[52] U.S. Cl. ..................................... 156/612; 156/613; 156/DIG. 83; 427/164; 423/593; 350/96 WG
[58] Field of Search ................ 156/DIG. 83, DIG. 63, 156/DIG. 73, 606, 612, 603, 613, 610; 23/273 R, 273 SP, 292; 432/265; 252/62.9 R, 62.9 P, 62.9 Z, 62.9 T; 423/593, 598; 427/164, 248; 350/96 WG

[56] References Cited

U.S. PATENT DOCUMENTS 3,997,690  12/1976  Chen .............................. 427/164 X
3,998,687  12/1976  Ballman et al. .................. 423/593 X

OTHER PUBLICATIONS

Holman, "Novel Uses of the Thermo-Microbalance in the Determination of Nonstoichiometry in Complex Oxide Systems", J. Vac. Sci. Techol., vol. 11, No. 1, Jan./Feb. 1974, pp, 434–439.
Holman et al., "Intrinsic Nonstoichiometry in the Head Zirconate-Lead Titanate System Determined by Knudsen Effusion", J. Appl. Phys., vol. 44, No. 12, Dec. 1973, pp. 5227–5236.

*Primary Examiner*—Norman Yudkoff
*Attorney, Agent, or Firm*—James J. Ralabate; James P. O'Sullivan; George J. Cannon

[57] ABSTRACT

The nonstoichiometry of a crystalline member is altered by promoting conditions of vapor phase equilibrium between the member and a slotted crucible in which it is placed. The slotted crucible comprises material sharing a common vapor species with the crystalline member and provides an atmosphere of substantially constant thermodynamic activity with respect to the shared vapor phase upon isothermal heating of the member and crucible. In one embodiment, by achieving a partial vapor phase equilibration between a transparent crystalline member and such a crucible both the magnitude and profile of the refractive index of the member near its surfaces is modified in a controlled member.

20 Claims, 19 Drawing Figures

SLOTTED CRUCIBLE FABRICATION

CONTROLLED ATMOSPHERE PROCESS FOR ALTERING THE NONSTOICHIOMETRY OF CRYSTALLINE MEMBERS

BACKGROUND OF THE INVENTION

This invention relates to vapor phase equilibration and more particularly, to vapor phase equilibration between two solids, one of which solids is a crystalline solid typically used in fabricating optical waveguiding members.

Optical waveguiding layers on either electro- or acousto-optical materials are attractive in a variety of discrete and integrated optical device applications that incorporate modulation, deflection and/or scanning of light. It is well known that an optical waveguiding slab structure requires that the refractive index of its thin surface region exceed that of its bulk. This has been accomplished in the past by an assortment of deposition techniques yielding a higher refractive index film adjacent to a lower index substrate. However, in general, deposition techniques have suffered from limited optical quality, homogeneity, and reproducibility, as well as a difficulty in modifying the refractive index gradient magnitude and profile.

In recent years, interest in forming active optical waveguiding structures has been stimulated by the need for optical modulators and deflectors, as well as for more efficient harmonic generators. To date, for device applications, experimental emphasis has been placed on those waveguides formed within, or on, single crystalline materials such as lithium niobates: J. M. Hammer and W. Phillips, Appl. Phys. Lett., 24, 545 (1974) I. P. Kaminow and J. R. Carruthers, Appl. Phys., Lett., 22, 326 (1973); J. R. Carruthers, I. P. Kaminow and L. W. Stulz, Appl. Opt., 13, 2333 (1974); I. P. Kaminow, J. R. Carruthers, E. H. Turner, and L. W. Stultz, Appl. Phys. Lett., 22, 540 (1973); U.S. Pat. Nos. 3,837,827 and 3,911,176. Single crystalline materials such as the garnets have also been emphasized: P. K. Tien, R. J. Martin, S. L. Blank, S. H. Wemple, and L. J. Varnerin, Appl. Phys. Lett., 21, 207 (1972); P. K. Tien, R. J. Martin, R. Wolfe, R. C. LeCraw and S. L. Blank, Appl. Phys. Lett., 21, 397 (1972); and P. K. Tient and D. P. Schinke, J. Appl. Phys., 45, 2059 (1974).

Promising results have been obtained by forming a thin layer within a substrate such as, for example, by diffusion, ion exchange, or ion implantation. See, for example, the extensive reference list contained in P. K. Tien and A. A. Ballman, J. Vac. Technol., 12, 892 (1975). Vacuum out diffusion such as reported in the lithium niobate articles cited above produces a nonstoichiometric waveguide layer characterized by a large defect concentration of lattice vacancies and the formation of lithium deficient phases at, or near, the surface. Metal ion, in-diffused waveguides such as reported in the above cited articles on garnets and in R. V. Schmidt and I. P. Kaminow, Appl. Phys. Lett., 25, 458 (1974) and in J. Noda, T. Saku and N. Uchida, Appl. Phys. Lett., 25, 308 (1974) develop equivalent defect concentrations of lattice vacancies and usually leave a residual layer of nondiffused oxide on the surface.

Neither approach offers sufficient flexibility in adjusting either the magnitude of the refractive index change or the shape of the refractive index profile to provide reproducible results of the degree of stability required for stabilization and interchangeability of like components in fine tuned integrated optical circuitry.

The present invention expands upon techniques developed by the inventor and reported in "Intrinsic and Extrinsic Nonstoichiometry in the Lead Zirconate-Titanate System", Ph. D. Thesis, Univ. of Calif., Berkeley, 1972 (LBL-880); "Intrinsic Nonstoichiometry in the Lead Zirconate-Lead Titanate System Determined by Knudsen Effusion," J. Appl. Phys., 44, 5227 (1973); and "Novel Uses of the Thermo-Microbalance in the Determination of Nonstoichiometry in Complex Oxide Systems," J. Vac. Sci. Technol., 11, 434 (1974) to solve the reproducibility problem in optical waveguides and to control the magnitude and profile of the optical index of refraction therein; and, to achieve mass transport under vapor phase equilibrium conditions between solids having a common vapor phase whose vapor pressure is less than about $10^{-4}$ 1 atm by redesigning the crucibles used in the inventor's previous techniques.

Another difficulty is that even in commercially supplied crystals to sample-to sample variances have heretofore precluded standardization of index of refraction for a given crystalline material. Furthermore, a need exists for a method of neutralizing optical damage in crystalline materials and in waveguide layers of crystalline members.

SUMMARY OF THE INVENTION

Therefore, an object of this invention is to overcome the above-noted deficiencies by providing a novel method for vapor phase equilibration between a crystalline member and another solid.

Another object of this invention is to provide a novel method for forming a waveguiding layer in a transparent crystalline member.

A further object of this invention is to provide a novel vapor phase equilibration method for forming a waveguiding layer.

Yet another object of this invention is to provide a method for controlling the magnitude of the optical index refraction in a waveguiding layer.

Still another object of this invention is to provide a process for neutralizing optical damage in crystalline materials.

A further object of this invention is to provide a process for eliminating substantial sample-to-sample variances in the index of refraction of crystalline materials.

Another object of the present invention is to provide a method of analyzing nonstoichiometric materials that cannot be assayed accurately by standard means of quantitative analysis.

These and other objects are provided in accordance with the present invention by altering the nonstoichiometry of a crystalline member (optionally completely for homogeneity or partially to inpart an optical index of refraction in the altered region which is greater than that of the remaining, unaltered bulk of the member) by isothermally heating the member within a slotted crucible comprising material having a vapor phase in common with the member at the heating temperature.

DETAILED DESCRIPTION OF THE PREFERRED EMBODIMENT

I. Introduction

It is to be understood that the present invention applies to all A-B systems that are composed of two or more components chosen so that system vaporization occurs incongruently and therefore preferentially with only a single component exhibiting a total partial pressure between $10^{-8}$ 1 atm at temperatures below the liquidus of the system. Hence, component A may be any volatile metal, oxide or sulfide, whereas component B must be either one or more compatible non-volatile metal oxide, or metal sulfide. The practice of the present invention further requires that the system possess at least one intermediate single phase, such as AB$_m$, that can be synthesized in the form of crystalline members; transparent plates, discs, rods, etc. In making optical waveguides the intermediate single phase must be capable of synthesis into a transparent crystalline member. By "transparent" is meant optically transparent over the wavelengths of interest of light to be guided.

Illustration of A-B Systems

Figure 1:
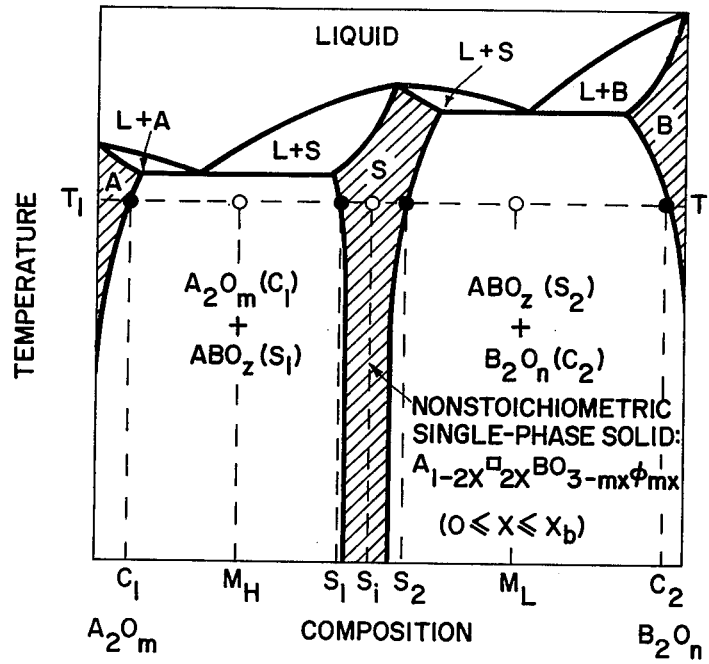
FIG. 1 is a schematic illustration of phase equilibria idealized as a function of temperature.
Figure 2:
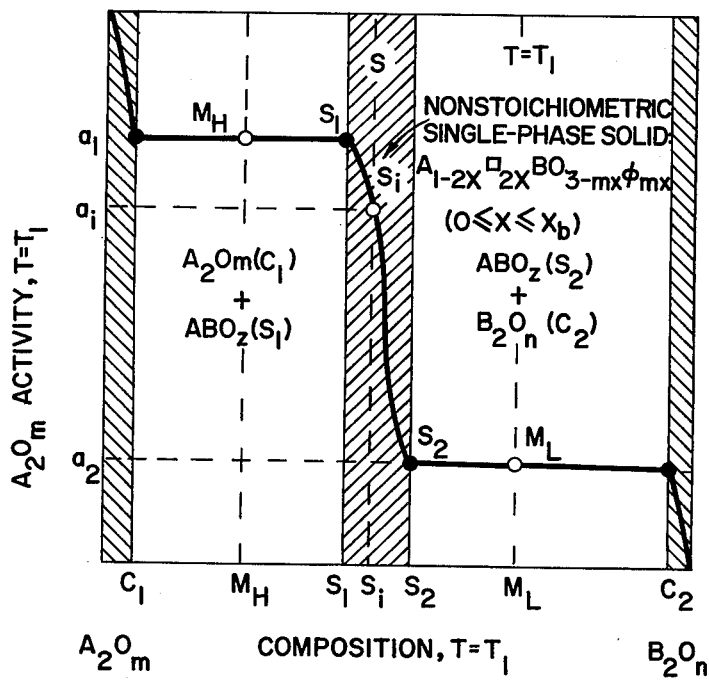
FIG. 2 is a schematic illustration of the activity of the vapor phase shared by the crystalline member and slotted crucible at a temperature, $T_1$, idealized as a function of compositions.

Illustrative of such systems ar multicomponent oxide systems that form nonstoichiometric solid phases which vaporize incongruently. See Table I, below. The behavior of such systems can be understood by referring to FIG. 1. Here component A is A$_2$O$_m$; component B is B$_2$O$_n$ and intermediate shared phase AB$_m$ is ABO$_z$. The system, A$_2$O$_m$—B$_2$O$_n$, possesses at least one intermediate phase, ABO$_z$ (z=(m + n)/2), whose A$_2$O$_m$ vapor species predominate at temperature T, and whose non-stoichiometry (with respect to A$_2$O$_m$) can be described by:

$$[ABO_z] \rightleftharpoons [A_{1-2x} \square_{2x} B O_{z-mx} \phi_{mx}] + x A_2 O_m$$

where $\square$ = A sublattice vacancy, $\phi$ = oxygen sublattice vacancy, and $m$ = the valence state of A. It may be assumed that the solid, ABO$_z$, is stoichiometric and that additional A$^{m+}$ or O$^{2-}$ concentration results in the formation of a second equilibrium (A$_2$O$_m$ — rich) phase, whereas, deficiencies of A$^{m+}$ and O$^{2-}$ beyond concentrations 2x and x respectively, result in the formation of another (A$_2$O$_m$-deficient) phase. The A and O sublattice vacancies are assumed to form in Shottky equilibria, with the equilibrium concentration of B sublattice vacancies negligible in comparison. Phase equilibria is idealized as a function of temperature in FIG. 1 and is described at temperature T$_1$ by the activity-composition diagram, FIG. 2. It follows that the solid designated S$_i$ is free to become either more or less non-stoichiometric, by the loss of gain of subcomponent A$_2$O$_m$. At temperature T$_1$, the A$_2$O$_m$ rich phase, C$_1$ will be in equilibrium with the stoichiometric solid, ABO$_z$, and for any ratio of C$_1$ and S$_1$, the activity of A$_2$O$_m$, $a_{A_2O_m}$, will remain constant ($a_1$). Similarly, the nonstoichiometric solid, $A_{1-2x_b} \square_{2x_b} BO_{z-mx_b} \phi_{mx_b}$, S$_2$, will be in equilibrium with B$_2$O$_{m_{ss}}$, whose mixtures retain constant activity, $a_2$.

Hence, if the two-phase mixture, M$_H$, is separated from the single phase nonstoichiometric solid, S$_i$, interaction between M$_H$ and S$_i$ will occur via the vapor phase until the activity of A$_2$O$_m$ in S$_i$ is increased from $a_i$ to $a_1$. The activity gradient produces a net flux of A$_2$O$_m$ molecules from M$_H$ to S$_i$ such that impingement of A$_2$O$_m$ molecules of the vapor exposed surface of S$_i$ causes the surface concentration of A$_2$O$_m$ in S$_i$ to increase and diffusion of A$^{m+}$ and O$^{2-}$ ions to occur. The condensation and diffusion of A$_2$O$_m$ produces a mass gain as the equilibration of S$_i$ and M$_H$ proceeds.

Complete Vapor Phase Equilibration

Figure 3A:
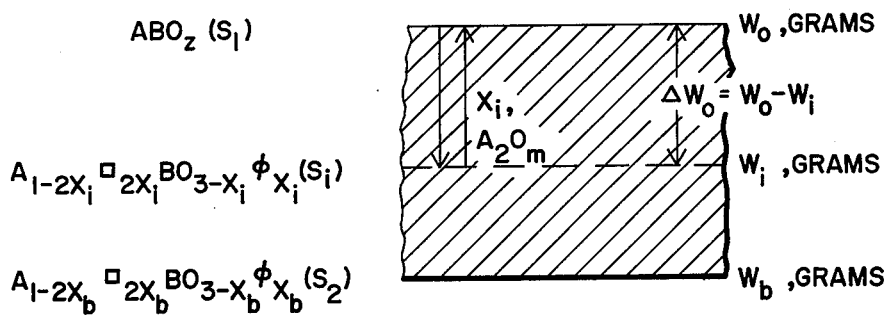
FIGS. 3(a) and (b) are illustrative diagrams of compositional changes, and weight changes associated therewith, illustrated in FIGS. 1 and 2.
Figure 3B:
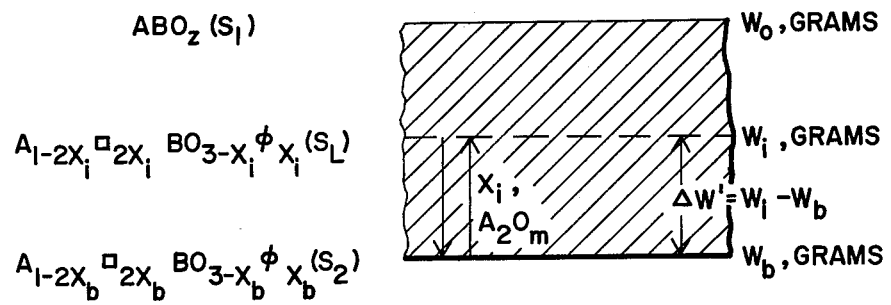

As the activity of A$_2$O$_m$ in S$_i$ is raised from $a_i$ to $a_1$ throughout S, the solid S$_i$ becomes completely equilibrated with the mixture M$_H$ via the intervening vapor phase and its composition increases to S$_1$ or ABO$_z$. In general, the compositional changes diagramed in FIGS. 3a and 3B can be related to the corresponding weight changes by the following expressions:

$$\Delta W_o = \frac{W_i x_o M_{A_2O_m}}{M_{ABO_z} - x_o M_{A_2O_m}} \tag{1}$$

$$x_o = \frac{\Delta W_o M_{ABO_z}}{(W_i + \Delta W_o) M_{A_2O_m}} = \frac{\Delta W_o M_{ABO_z}}{W_o M_{A_2O_m}} \tag{2}$$

$$\Delta W_b = \frac{W_i x b\, M_{A_2O_m}}{M_{ABO_z} - x_b M_{A_2O_m}} \tag{3}$$

$$x_b = \frac{\Delta W_b M_{ABO_z}}{(W_i + \Delta W_b) M_{A_2O_m}} = \frac{\Delta W_b M_{ABO_z}}{W_o M_{A_2O_m}} \tag{4}$$

and $$\Delta W' = \frac{W_b x' M_{A_2O_m}}{M_{ABO_z} - x_b M_{A_2O_m}} = \frac{W_i x' M_{A_2O_m}}{M_{ABO_z} - (x_b - x') M_{A_2O_m}} \tag{5}$$

$$x' = \frac{\Delta W' (M_{ABO_z} - x_b M_{A_2O_m})}{(W_i - \Delta W') M_{A_2O_m}} \tag{6}$$

where $\Delta W_o$ is the weight change in grams of a nonstoichiometric solid, $S_i$, whose composition changes to $S_1$; $\Delta W'$ is the weight change in grams of a nonstoichiometric solid, $S_1$, whose composition changes to $S_2$; $\Delta W_b$ is the weight change in grams when a solid of one phase boundary composition changes to that of the other; $W_i$ is the weight in grams of nonstoichiometric solid, $S_i$; $W_o$ is the weight in grams of the stoichiometric solid $S_1$; $W_b$ is the weight in grams of the nonstoichiometric $S_2$; $M_{ABO_z}$ and $M_{A_2O_m}$ are the molecular weights in grams/mole of the stoichiometric solid, $S_1$, and the vapor species, $A_2O_m$, respectively; and $x_o$, $x'$, and $x_b$ are the compositional changes in moles. These expressions reveal how the mass-changes corresponding to complete equilibration of nonstoichiometric solids can be used to describe phase equilibria and nonstoichiometry.

Specifically, the compositional width of the single-phase region, or the maximum degree of nonstoichiometry tolerable, $x_b$, can be determined (equations 3 and 4), by equilibrating nonstoichiometric solid, $S_i$, with mixture $M_H$, and then equilibrating the resulting solid, $S_1$ (ABO$_z$), with mixture $M_L$, while measuring the weight change, $\Delta W_b$ produced.

Similarly, the degree of nonstoichiometry $x_o$, of any single phase nonstoichiometric solid, $S_i$, can be determined from its weight change, $\Delta W_o$, resulting from equilibration with $M_H$, (equations 1 and 2).

In addition, vapor phase equilibration can be applied as a process for homogenizing a single phase nonstoichiometric solid with respect to any degree of nonstoichiometry. Mixtures $M_H$ and $M_L$ can convert solid $S_i$ to either $S_1$ or $S_2$ (FIGS. 1 and 2) Equivalently, an infinite number of mixtures, $M_i$, can be designed to establish $A_2O_m$ activities between $a_1$ and $a_2$, by diluting the nonvolatile $B_2O_n$ composition with a nonvolatile subcomponent $C_2O_y$.

Partial Vapor Phase Equilibration

During the equilibration of $S_i$ and, for example $M_H$, the $A_2O_m$ concentration is increased, first at a vapor/solid interface, and then as a consequence of diffusion, within the bulk. The functional form of the $A_2O_m$ concentration distribution, including the rate at which it changes, is determined by the bulk diffusion kinetics and by the vapor/solid interfacial reactions. Although these mechanisms are often interdependent and vary from system-to-system, they can be modeled phenomenologically by means of the mathematics of diffusion. By terminating diffusion before complete equilibration the magnitude and profile of the $A_2O_m$ concentration in the crystalline member is controlled, thereby controlling the magnitude and profile of the refractive index near surfaces of the crystalline member.

General Applicability to Nonstoichiometric Materials

Complete and partial vapor phase equilibration can be applied to any A-B system of two or more components that contains at least one intermediate nonstoichiometric phase $AB_m$ such that vaporization of $AB_m$ occurs incongruently, and therefore preferentially, with only a single subcomponent, A, exhibiting a significant partial pressure at temperatures below the liquidus of the system. Consequently, subcomponent A can be any volatile metal, oxide, or sulfide, etc., whereas subcomponent B must be either one or more relatively nonvolatile compatible constituents. The Intermediate solid $AB_m$ may be either a single or polycrystalline material in the form of a slab or a thin film. A partial listing of applicable materials is summarized in Table I.

TABLE I

| CLASS | VOLATILE COMPONENT | TYPICAL COMPOUNDS | FE | EO | AO | SX | PX | OD | ID |
|---|---|---|---|---|---|---|---|---|---|
| 1. COMPLEX LEAD OXIDES | PbO | (Pb,La) (Zn,Ti)O$_3$ "PLZT" | X | X | | | X | | X |
| | | PbWO$_4$ etc. | | | X | X | X | | |
| | | PbNb$_2$O$_6$ etc. | X | X | | X | X | | X |
| | | PbTa$_2$O$_6$ etc. | X | X | | X | X | | X |
| | | Pb$_2$Si$_2$O$_7$ etc. | ? | ? | | X | X | | X |
| 2. COMPLEX BISMUTH OXIDES | Bi$_2$O$_3$ | Bi$_4$Ti$_3$O$_{12}$ etc. | X | X | | X | X | | X |
| 3. COMPLEX MOLYBDENUM OXIDES | MoO$_3$ | RMoO$_4$ etc. R=(Gd,Ba,Cd,Ca*, Mg*,Sr) | | | X | X | X | X | * |
| | | MoAl$_2$O$_4$ etc. | | ? | | ? | X | * | X |
| 4. COMPLEX TIN OXIDES | SnO$_4$ | RSnO$_3$ etc. R=(Ba,Cd*,Ca,Mg, Sr) | | ? | | | X | | X |
| | | SnCo$_2$O$_4$ etc. | | ? | | | X | | X |
| 5. COMPLEX GERMANIUM OXIDES | GeO$_4$ | R$_4$Ge$_3$O$_{012}$ etc. R=(Ba,Cd*,Ca,Mg, Sr) | X | X | | X | X | * | X |
| 6. COMPLEX LITHIUM OXIDES | Li$_2$O | LiMO$_3$ etc. M=(Nb,Ta,V) | X | X | | X | X | X | |
| 7. COMPLEX SODIUM, POTASSIUM, and/or RUBIDIUM OXIDES | Na$_2$O K$_2$O Rb$_2$O | R$_1$ (R$_2$)O$_3$ etc. R$_1$=(Na,K,Rb) R$_2$=(Nb,Ta,V) | X | X | | ? | X | X | |
| 8. COMPLEX CADMIUM SULFIDES, SELENIDES, and/or TELURIDES | CdS CdSe CdTe | Cd$_x$Mn$_{1-x}$S etc. | | | | X | X | | X |
| 9. COMPLEX BORON | BO$_2$ | FeBO$_3$ | | | | X | X | X | |

TABLE I-continued

| CLASS | VOLATILE COMPONENT | TYPICAL COMPOUNDS | FE | EO | AO | SX | PX | OD | ID |
|---|---|---|---|---|---|---|---|---|---|
| OXIDES | | | | | | | | | |

FE=FERROELECTRIC
EO=ELECTROOPTIC
AO=ACOUSTOOPTIC
SX=SINGLE CRYSTALLINE
PX=POLYCRYSTALLINE
OD="OUT-DIFFUSED"
ID="IN-DIFFUSED"
NOTE: Compounds with more than a single vapor species (i.e., $PbMoO_4$) are not precluded if vaporization is incongruent.

Wave Guiding Layers

Through partial vapor phase equilibration, optical waveguiding layers in $AB_m$ can be formed. Formation of optical waveguiding layers in $AB_m$ requires additionally, that its refractive indices are altered by departures from stoichiometry. A simple experiment can be performed to determine whether in-diffusion or out-diffusion of subcomponent A will serve to increase the refractive index of $AB_m$. Complete vapor phase equilibration can be applied to form sample compositions of maximum and minimum departure from stoichiometry (or the most A — rich and A — deficient compositions) followed by a direct measurement of their refractive indices. If the refractive index of the more nonstoichiometric material is larger, a waveguide may be formed by diffusing A out of the more stoichiometric $AB_m$ composition, (e.g., $LiNbO_3$). If the refractive index of the more stoichiometric material is larger, a waveguide may be formed by diffusing A into the more nonstoichiometric composition (e.g., PLZT).

A preliminary prediction can be made prior to measurement on the basis of a simple qualitative model: The refractive index of nonstoichiometric $AB_m$ will increase if either the concentration of its most polarizable species is increased, or if the polarizability of this species is increased by removal of a less polarizable species. Hence, if A is more polarizable than B, a waveguide can be formed by the diffusion of A into relatively nonstoichiometric $AB_m$. If B is more polarizable than A, a waveguide may be formed by diffusion of A out of relatively stoichiometric $AB_m$. Electronic and ionic polarizabilities increase generally as a function of atomic weight. This method of prediction is applied to the material listed in Table I and accounts correctly for the observed behavior of $LiNbO_3$, $LiTaO_3$ and PLZT. The net result is the same: an increase in the relative concentration of the most polarizable cation over the less polarizable cation. As a practical matter, the decision to pick either in-diffusion or out-diffusion to obtain the increase in relative concentration depends upon which cation (the more polarizable or the less polarizable) is more volatile. That is, which is more easily removed by vaporization or which has more rapid diffusion).

If the most polarizable cation is also the cation most easily volatized, then the index of refraction is most simply increased by in-diffusion. If the most polarizable cation is not the most volatile, then the index of refraction is increased by out-diffusion of the less polarizable cation. These criteria allow direct, simple prediction of how to practice the invention on any crystalline member to achieve the refractive index increase provided by the invention along surface regions of the crystalline member. Tables of polarizability and volatility exist and can be readily consulted by one skilled in the art to predict which of in and out diffusion is to be selected in accordance with the teaching herein.

However, even though this is predicted, a particular crystalline member may be stoichiometric and require a two step process for the following reasons. As previously indicated, the non-stoichiometry of the crystalline member; i.e., the vacancies on the sublattice are exploited to control in a reproducible manner the magnitude of the refractive index increase along the surface of the transparent crystalline member. This assumes that the member is nonstoichiometric. Experimentally, a stoichiometric crystalline member will not in-diffuse and gain weight so that there is no change in concentration along the surface regions and therefore no refractive index change. Only out-diffusion can occur. If the particular crystalline member is non-stoichiometric then, of course, in-diffusion or out-diffusion can occur.

Thus, if the process prediction is in-diffusion and the crystalline member is stoichiometric, the member is homogeneously out-diffused and followed with in-diffusion for a period of time sufficient to form the desired domain of the layer or region of increased refractive index and the member is not allowed to become homogeneously in-diffused. The particular sample of transparent crystalline member to be used can be easily identified as stoichiometric or non-stoichiometric simply by attempting to in-diffuse and observing whether there is a weight gain to the sample.

The magnitude of the activity gradient that is established between the crystalline member and the atmosphere within the crucible determines the surface concentration of the crystalline member and therefore the magnitude of the refractive index gradient produced. This activity gradient may be adjusted in at least two ways:

1. the initial composition of the crystalline member $A_{1-2x}\square_{2x}BO_{z-mx}\phi_{mx}$ may be pre-established anywhere within its single phase region, $O \leq x \leq x_b$. Hence, the activity difference between the sample, and for example, the constant $A_2O_m$ activity of composition $S_2$, can be set as desired; and 2. the composition of the multi-phase container that provides the $A_2O_m$ atmosphere, can be chosen so that it provides a lower $A_2O_m$ activity than that of composition $S_2$. This can be accomplished by an infinite number of compositions or mixtures selected from the set of $A_2O_m$—$C_2O_n$ multicomponent complex oxide systems, where $C_2O_n$ symbolizes any series of two or more non-volatile oxides, compatible with $A_2O_m$, and may include $B_2O_n$. In practice, these activities must be predetermined experimentally by a technique such as massloss Knudsen effusion as described in my previously referenced Ph.D. thesis.

As the sample and the chosen $A_2O_m$ atmosphere react, several simultaneous mechanisms occur: (i) $A_2O_m$ molecules condense on the sample surface as a result of the $A_2O_m$ activity (chemical potential) gradient, (ii) the $A_2O_m$ molecules dissociate into $A^{2m+}$ and $O^{2-}$ ions and (iii) the $A^{2m+}$ and $O^{2m-}$ ions dissolve into the $A_{1-2x}\square_{2x}BO_{z-mx}\phi_{mx}$ structure by diffusion into the bulk at a rate controlled by the temperature and composition dependence of the diffusion coefficients. If the diffusion rate exceeds the condensation rate, the sample tends to equilibrate quickly with the atmosphere, and form either very thick layers or a completely homogenized sample. However, if the temperature is adjusted so that the rate of diffusion is small compared to the rate of condensation, the $A_2O_m$ concentration at the surface of the crystalline member is maintained by the activity gradient, holding the surface composition nearly fixed, as diffusion into the bulk with time produces the concentration profile and attendant weight gain.

Figure 4A:
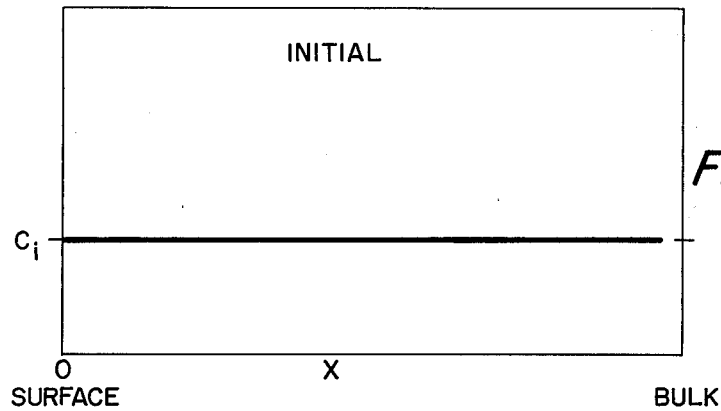
FIGS. 4(a), (b) and (c) are typically expected concentration profiles as a function of in-diffusion into a crystalline member.
Figure 4B:
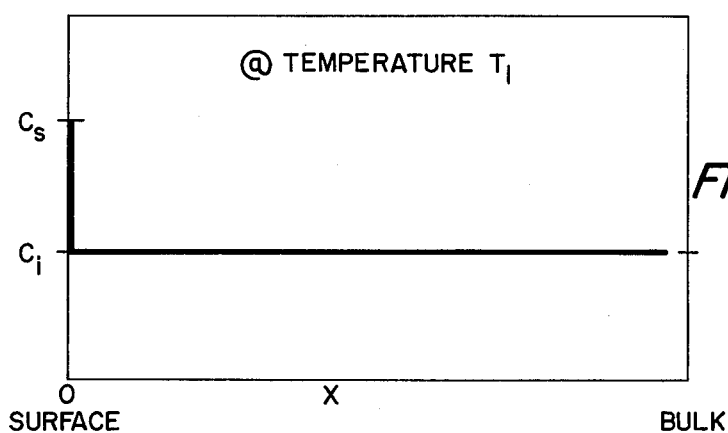
Figure 4C:
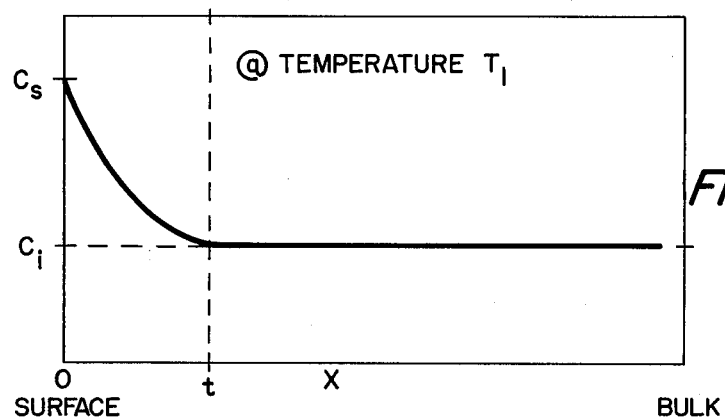

Typical profiles are sketched in FIGS. 4a, 4b and 4c with the x direction taken normal to and away from the surface. Initially, this sample is homogeneous with $A_2O_m$ concentration $c_i$ as in FIG. 4a. The $A_2O_m$ concentration at the surface rises to $c_s$ as a result of exposure to the $A_2O_m$ atmosphere and the activity gradient, as in FIG. 4b. The surface concentration remains $c_s$ upon further heating, and an $A_2O_m$ concentration gradient, ($c_s - c_i$), develops over a thickness, t, as in FIG. 4c. These typical diffusional $A_2O_m$ concentration profiles, similar to that shown in FIG. 4c are expected if the diffusivities of the $A^{2m+}$ and $O^{2-}$ ions are concentration dependent. However, the diffusivity in these nonstoichiometric systems can be very concentration dependent. In fact, the diffusivities are found to be greater when there are a larger number of lattice vacancies, and lower in their absense. This departure from ideality can be utilized to exert control over the shape of the $A_2O_m$ concentration profile.

Figure 5:
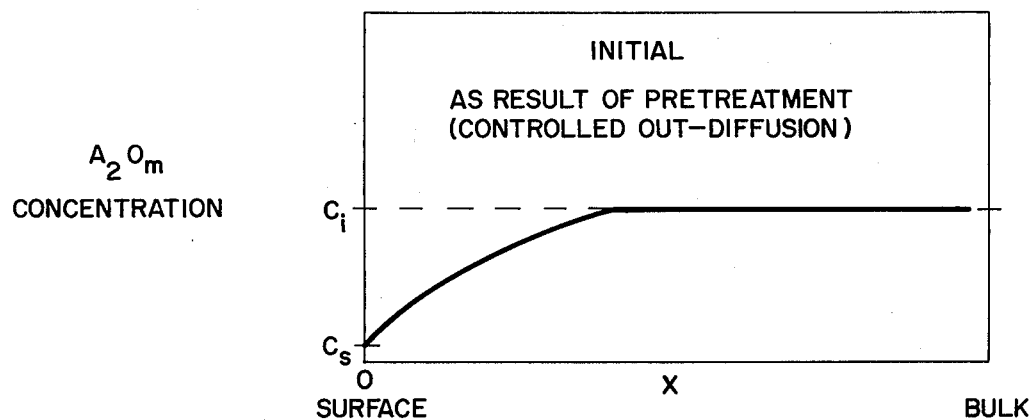
FIG. 5 is a schematic illustration of an obtainable concentration profile as a function of out-diffusion from a crystalline member.
Figure 6:
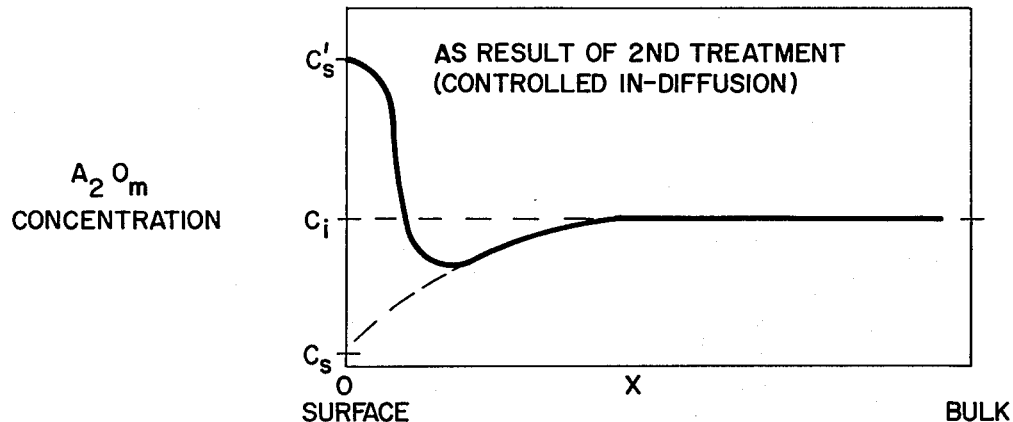
FIG. 6 is a schematic illustration of how the expected profile of 4(c) is altered by first out-diffusing per FIG. 5 followed by in-diffusion.

For example, a sample initially homogeneous with respect to $A_2O_m$ concentration $c_i$, as in FIG. 4a, is modified by the controlled "out-diffusion" and $A_2O_m$ such that is concentration profile is altered, as in FIG. 5. Subsequent heating of this sample in a higher $A_2O_m$ activity atmosphere, such as composition $S_2$ will produce an in-diffusion of $A_2O_m$ as before. However, the diffusion kinetics will be modified. Specifically, the $A^{2m+}$ and $O^{2-}$ ions diffuse at a greater rate near the surface than further into the bulk. This treatment favors a more nearly abrupt, or superlinear, gradient, as in FIG. 6. Of course, multiple heatings, in this manner, can produce multiple layers, effectively burying the waveguide within the structure.

Figure 7:
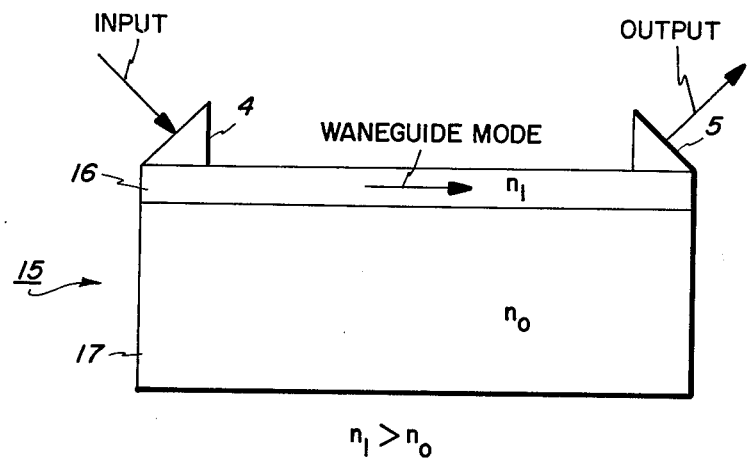
FIG. 7 is a schematic illustration of a waveguiding crystalline member.

Typical suitable materials for the practice of the waveguide forming embodiment of the present invention are listed in Table I. Many others can be employed. To form a waveguide 15, the waveguide layer 16 of FIG. 7 must have an optical index of refraction $n_1$ greater than the underlying layer of substrate 17 refractive index $n_o$. Light entering input coupler 4 will be coupled into waveguiding layer 16 and propagate in a waveguiding mode to output coupler 5 where it is decoupled and propagated in its conventional ambient mode, typically in air. For waveguiding to occur certain conditions must be met. These are set forth in "Light Waves in Thin Films and Integrated Optics," P. K. Tien, Vol. 10, No. 11, Applied Optics, P. 2395 (1971). The application of these conditions are known in the art and need not be elaborated upon herein.

In order to obtain $n_1$ greater than $n_o$ in the present invention, where $n_1$ is the depth dependent refractive index of the altered region of the transparent crystalline member and $n_o$ is the refractive index of the remaining bulk of the transparent crystalline member, it is necessary in the final waveguiding forming step to either in-diffuse or out-diffuse, depending upon the composition of the transparent crystalline member. In Table I, each representative material is indicated as requiring either out-diffusion (OD) or in-diffusion (ID) to obtain $n_1 > n_o$.

When the present invention is practiced with transparent crystalline members of single crystalline structure, the member is ready for use as a waveguide without further treatment. For members of polycrystalline structure, however, the practice of the present invention can result in thermal grooving of surface exposed grain boundaries and the formation of a high density of submicron intrusions within the surface grains, thus increasing the optical scattering of the member. By mechanically polishing the member surfaces with fine diamond paste, the original high quality surface can be restored. Diamond particles of about 0.25 microns in average diameter are sufficiently fine to accomplish the polishing without adversely reducing the thickness of the waveguiding layer.

Process Environment

Figure 8:
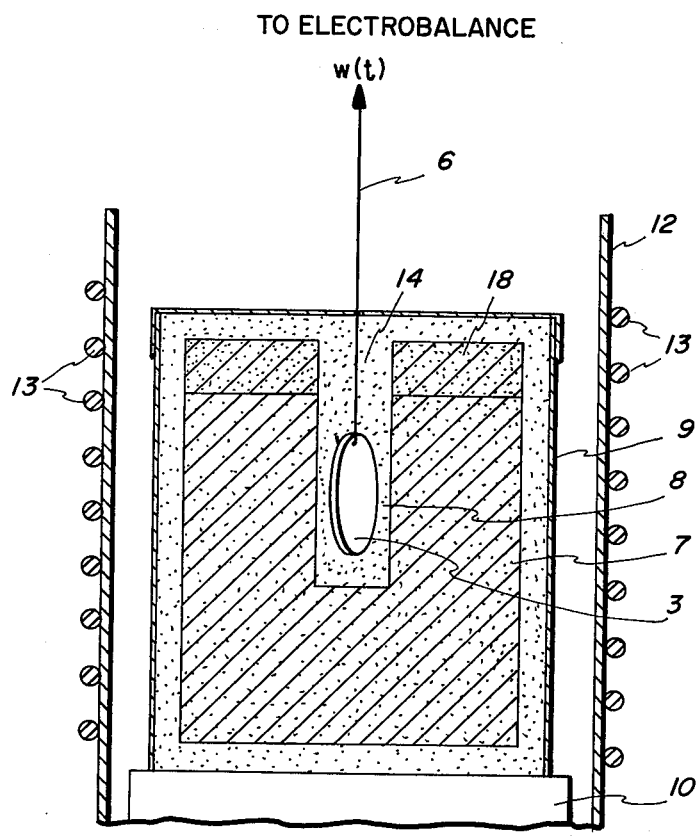
FIG. 8 is a schematic illustration of the environment of the process of the present invention.

FIG. 8 schematically illustrates a suitable process environment. Transparent crystalline member 3 is suspended within crucible 7 comprising material having a vapor phase in common with crystalline member 3. Dots 8 represent the shared vapor phase $A_2O_m$ which, owing to the large mass of crucible 7 relative to member 3, is constant in activity (i.e., partial pressure, chemical potential and other thermodynamic parameters of the atmosphere are constant with respect to the shared vapor phase). For precise definitions of these commonly used thermodynamic quantities, see, for example, Solid State Thermodynamics, R. A. Swalin, John Wiley and Sons, New York 1962. Crucible 7 sits within muffel-crucible 9, typically of platinum, which in turn rests upon pedestal 10. The muffel crucible 9 and pedestal 10 are placed within furnace 12 and isothermally heated by heating elements 12. The crucible 7 is open to the atmosphere via opening 14 and therefore the $A_2O_m$ vapor phase 8 must diffuse through air.

The identity of the gas through which the $A_2O_m$ vapor phase must diffuse (air in FIG. 8) does effect the kinetics of solid state diffusion within the crystalline member. Atmospheric air as the gas is preferred for the numerous complex oxides with which the invention can be practiced to assure the presence of any necessary equilibrium oxygen partial pressure in the controlled atmosphere surrounding the crystalline member. However, gases other than air can be employed when the vapor phase activity gradient is too small to overcome the resistance of the gas diffusion of the $A_2O_m$ vapor phase between the crystalline member and crucible (in either in or out diffusion). As used herein, activity gradient means the difference in activity with respect to the shared vapor phase between the crucible and the crystalline member divided by the distance separating the crystalline member and the crucible. Generally speaking, the rate of transport of the $A_2O_m$ vapor phase between the crucible and crystalline member depends upon mobility, activity gradient and degree of thermal convection. The mobility depends upon temperature and the identity of the gas, the pressure of the gas and the size of the gas molecules. Given a constant vapor phase mobility, a constant temperature and a constant pressure the rate of $A_2O_m$ transport is determined by the activity gradient of the $A_3O_m$ vapor phase. Alternately, with a constant acitivity gradient, a constant temperature and pressure, the mobility of the $A_2O_m$ vapor phase can be increased by substituting gases; or, without substituting gases, the amount of gas employed can be reduced to provide a reduced pressure of the background gas (i.e. air) at the isothermal heating step thereby allowing an increased mobility of the $A_2O_m$ vapor phase. However, for typically small crystalline member-crucible separation distance, thermal convection wll most likely provide the dominate influence.

II. EXPERIMENTAL

The invention will now be described by way of example in further detail, it being understood that these are intended to be illustrative, only, and that the invention is not limited to the conditions, material, procedures, etc. recited therein. All parts and percentages are by weight unless otherwise specified.

Thin optically transparent polished single crystalline discs of $LiNbO_3$ and polycrystalline PLZT were heated isothermally within special reaction crucibles and their weight changes were recorded gravimetrically. Complete equilibration between disc and crucible was performed to establish the phase boundary compositions, the degree of nonstoichiometry, and the diffusion kinetics. Partial equilibration was performed to form structures of graded non-stiochiometry suitable for optical waveguiding. X-ray diffraction, optical microscopy and scanning electron microscopy were employed to detect gross compositional and microstructural changes.

Preparation of Slotted Constant Activity Multi-Phase (CAMP) Crucibles

The vapor phase equilibration of two condensed phases, as previously discussed, requires that one substance behave as a constant source of, or sink for, their common vapor species. This is possible if the effective diffusion rate of the volatile subcomponent within one substance is sufficient to maintain equilibrium with the vapor at its vapor exposed surface such that its chemical potential or activity remains constant. In addition, the transport of the vapor species between the two substances must be sufficiently rapid so as not to influence the equilibration kinetics.

These requirements are particularly satisfied by a porous crucible, as in FIG. 8, composed of two or more homogeneously mixed equilibrium phases, and uniquely formed so as to define a cavity or "slot" such that the spacing between its walls and the inserted materials to be equilibrated is sufficiently small to produce mass transport under equilibrium conditions. One to three millimeters is satisfactory for materials listed in Table I. This spacing tolerance is required in order to obtain mass transport, when the common vapor phase is one having a pressure less than about $10^{-4}$ atmosphere. For example, the crucible cavity described in my aforementioned Ph.D thesis will not provide mass transport under vapor phase equilibrium conditions when the common vapor phase is one having a pressure less than about $10^{-4}$ atmosphere. CAMP crucibles were fabricated according to FIGS. 8(b) and 8(c) by mixing homogeneously proportions of reagent grade oxides or carbonates indicated in Tables II, a and b. About 20 vol. % finely crushed napthalene crystals were added as a binder and porosity control. Approximately 100 grams of the lithium niobate (Table II. a.) mixture and approximately 250 grams of the PLZT mixture (Table II. b.) were separately pressed isostatically (30,000 psi) in cylindrical rubber bags (2 inches in diameter) about a slightly tapered aluminum bar. Caps 18 were sawed from a separately pressed cylinder of the mixtures. The napthalene was burned out, slowly (3° c/min), by heating for 12 hours at 250° C. Both the caps 18 and the crucibles 7 were calcined in air within clean covered alumina crucibles, ("$LiNbO_3$": 12 hours at 1000° C then for 1 hour at 1100° C; "PLZT" : 24 hours, 850° C). A ⅛ inch diameter hole 14 was drilled in the center of each cap, so that the Pt hangdown wire 6 from a microbalance could be inserted into the CAMP crucible cavity through its cap to suspend a sample. The formation of multiphase crucibles was verified by X-ray diffraction.

TABLE II

SUMMARY OF SLOTTED CONSTANT ACTIVITY MULTI-PHASE (CAMP) CRUCIBLE COMPOSITIONS

II. a. $LiNbO_3$

| PHASE MIXTURE | MOLE FRACTION | |
|---|---|---|
| | $Li_2O$ | $Nb_2O_5$ |
| $LiNbO_3$ + $Li_3NbO_4$ | 0.65 | 0.35 |
| "$LiNbO_3$" + $LiNb_3O_8$ | 0.40 | 0.60 |

II. b. 8/65/35 PLZT

| PHASE MIXTURE | PLZT MOLAR COMPOSITION | | | | MOLAR EXCESS | |
|---|---|---|---|---|---|---|
| | $M°$ PbO | $M°$ $LaO_{1.5}$ | $M°$ $ZrO_2$ | $M°$ $TiO_2$ | M PbO | M $ZrO_2$ |
| PLZT (I) + $PbO_{ex}$ | .9025 | .08 | .65 | .35 | 0.5 | |
| PLZT (II) + $PbO_{ex}$ | .8726 | .08 | .65 | .35 | — | 0.1 |

Preparation of Crystalline Members

Single Crystal $LiNbO_3$

Optically transparent, colorless, single domain crystals of $LiNbO_3$ were obtained commercially from Crystal Technology, Inc. They were synthesized by the Czochralski technique, were grown along the c-axis, and were of unknown stoichiometry. The as-grown ferroelectric boules were poled along their c-axis after growth. The crystals were supplied as optically polished discs (0.750 × 0.030 inch) formed with their c-axis either parallel to (x-cut) or perpendicular to (z-cut), the plane surfaces.

Ion microprobe analysis was performed to establish the predominate impurities. The polished surfaces were found to contain a significant excess of iron, apparently a residue from the polishing procedure. A cleaning sequence was adopted to minimize this surface contamination. The crystals were degreased by consecutive treatment in trichlorethelyne, acetone, ethyl alcohol, and distilled water, followed by consecutive baths in dichromic acid and circulating distilled water. The crystals were then washed in dilute HCl, re-rinsed in circulating distilled water, and air dried in a dust-free laminar flow hood.

Prior to cleaning, a small hole was drilled (0.020 inch) through the plane surfaces of each crystal, near the rim, to enable suspension by a thin Pt wire.

Polycrystalline 8/65/35 PLZT

Optically transparent, fully dense 8/65/35 PLZT was prepared by gravimetric liquid phase sintering and by "hotpressing" (as obtained commercially from Honeywell Inc.). The sintered samples were formed as discs (0.350 inch diameter) and optically polished. The commercial "hot pressed" samples were formed as discs (0.750 × 0.030 inch) and optically polished. The discs were drilled and cleaned in the same manner used to drill and clean the $LiNbO_3$ discs.

Gravimetric Procedure

The thermogravimetric apparatus described in FIG. 8 is used in conjunction with the slotted CAMP crucibles. The single-phase crystalline members were suspended from a Cahn R-100 Recording Electrobalance by means of a Pt wire such that they could be centered within the slotted crucible cavity. An outer platinum muffel crucible was utilized to prolong the life of the PLZT crucibles.

Proper alignment of the single crystal $LiNbO_3$ samples within crucible cavities was complicated by a strong surface charge that caused their attraction to the cavity walls. This surface charge was neutralized, at room temperature, by pre-treating the sample and the crucible in GC-Spectrophotometric quality isopropyl alcohol, and air-drying in a dust free laminar flow hood. Although initial heating caused vaporization of the alcohol, instant return of the surface charge, and re-attraction to the cavity walls, heating above 600° C, neutralized the surface charge once again. Thermally neutralized, sample alignment was restored and accurate (+5−10 ug) continuous weighing possible. Background noise at 1100° C in air was primarily convection limited.

Phase Equilibria and Nonstoichiometry Data

Commercially supplied discs of single crystal $LiNbO_3$ or polycrystalline PLZT were broken into smaller pieces 300–500mg, drilled, cleaned, suspended within their high or low CAMP crucible (Table II), and heated (10° C/min to 850° C then at 20° C/min to the experimental temperature). The temperature was held until sample mass-change could not be detected. The total mass-change of the sample was recorded, and the temperature lowered rapidly to 600° C (20° C/min) and then furnace cooled. This procedure was repeated in alternating CAMP crucibles. Complete equilibration times varied from 5–100 hours depending upon sample weight and temperature.

The total reaction mass-changes, $M(\infty)$, for a variety of $LiNbO_3$ single crystals are summarized in Table III for alternate equilibrations in high and low CAMP crucibles at 1050°, 1100°, 1115° and 1140° C in air. The initial and phase boundary crystal compositions, $x_i$ and $x_b$, respectively, are calculated in terms of lithium oxide content by means of equations 2, 4 and 6.

Figure 9:
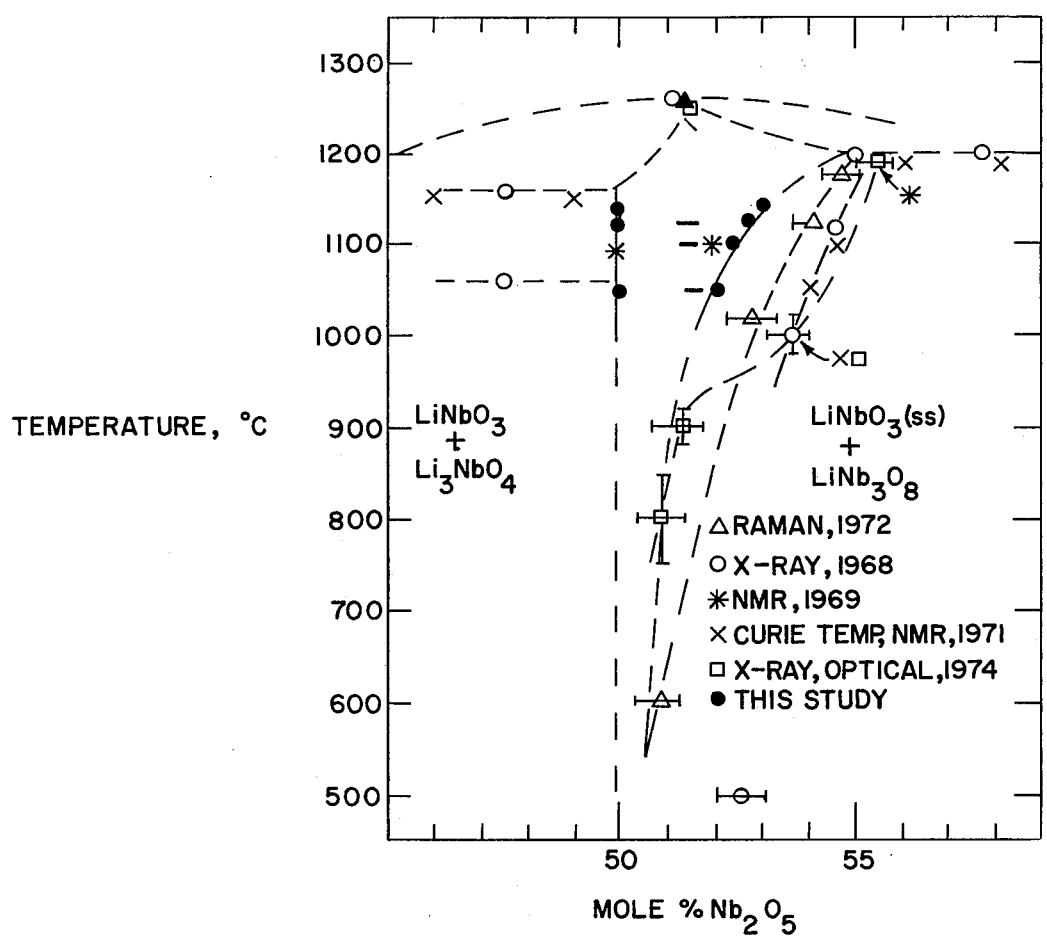
FIG. 9 is a plot of the maximum equilibrium deviations from stoichiometry for phase boundary compositions in the LiNbO$_3$ system.

The phase boundary compositions $x_b$ in Table III represent the maximum equilibrium deviations from stoichiometry, and are temperature dependent, decreasing in lithium oxide content as temperature increases. These results are plotted in FIG. 9, and are compared with reported $Li_2O\text{---}Nb_2O_5$ phase equilibria in the region of $LiNbO_3$. The initial crystal composition or nonstoichiometry, $x_i$, is referred to the stoichiometric composition, $LiNbO_3$, and as such is independent of temperature.

TABLE III.

COMPLETE VAPOR PHASE EQUILIBRATION OF SINGLE CRYSTAL $LiNbO_3$
CAMP Crucible I : $Li_3NbO_4 + LiNbO_3$
CAMP Crucible II : $LiNb_3O_8 + LiNbO_3$

$v = $ Mole Fraction $Li_2O = (0.5-x)/(1.0-x)$

| SAMPLE | | MASS-CHANGE $M(\infty)$ mgs | | | | INITIAL | | BOUNDARY | | TEMPERATURE |
|---|---|---|---|---|---|---|---|---|---|---|
| No. | Weight(gm) | I | II | I | II | $x_i$(mol) | $v_i$(%) | $x_b$(mol) | $v_b$(%) | °C |
| PE1 | 0.3763$^{12}$ | 2.6$^{04}$ | 2.9$^{89}$ | 2.9$^{77}$ | — | 0.0340$^0$ | 48.24$^0$ | 0.0389$^6$a | 47.97$^3$ | 1050 |
| PE2 | 0.2978$^{24}$ | — | 1.7$^{91}$ | 2.3$^{56}$ | 2.3$^{17}$ | 0.0297$^0$ | 48.46$^9$ | 0.0389$^0$b | 47.97$^6$ | |
| PE10 | 0.5269$^{11}$ | 3.4$^{10}$ | 5.0$^{50}$ | 4.9$^{97}$ | — | 0.0318$^2$ | 48.35$^7$ | 0.0468$^8$c | 47.54$^1$ | |
| PE11 | 0.9967$^{73}$ | 5.7$^{21}$ | 9.4$^{79}$ | 9.5$^{69}$ | — | 0.0282$^4$ | 48.54$^7$ | 0.0470$^1$d | 47.53$^4$ | 1100 |
| V12 | 0.9998$^{38}$ | 5.4$^{79}$ | 9.3$^{31}$ | 9.6$^{29}$ | — | 0.0269$^3$ | 48.61$^6$ | 0.0466$^6$c | 47.55$^3$ | |
| V15 | 1.0126$^{13}$ | 6.0$^{14}$ | — | — | — | 0.0292$^2$ | 48.49$^5$ | — | — | |
| PE8.1 | 0.3553$^{23}$ | 1.7$^{94}$ | 3.7$^{46}$ | 3.7$^{26}$ | — | 0.0248$^6$ | 48.72$^5$ | 0.0517$^7$f | 47.27$^0$ | |
| PE8.2 | 0.3045$^{11}$ | 1.5$^{46}$ | 3.2$^{12}$ | 3.2$^{38}$ | — | 0.249$^9$ | 48.71$^8$ | 0.521$^3$g | 47.25$^0$ | 1125 |
| PE8.3 | 0.3402$^{46}$ | 1.7$^{14}$ | 3.5$^{85}$ | 3.5$^{53}$ | — | 0.0248$^0$ | 48.72$^8$ | 0.0516$^5$h | 47.27$^7$ | |
| PE9 | 0.4142$^{19}$ | 2.7$^{76}$ | 4.3$^{68}$ | 4.3$^{82}$ | — | 0.0329$^4$ | 48.29$^7$ | 0.0519$^2$i | 47.26$^2$ | |
| PE14 | 0.4756$^{81}$ | 3.5$^{99}$ | 5.7$^{13}$ | 5.6$^{94}$ | — | 0.0371$^6$ | 48.07$^0$ | 0.588$^4$j | 46.87$^4$ | 1140 |

NOTES: Standard Deviation
a ± 0.00011
b ± 0.00002
c ± 0.00035
d ± 0.00031
e ± 0.00103
f ± 0.00019
g ± 0.00028
h ± 0.00032
i ± 0.00012
j ± 0.00020

Figure 10A:
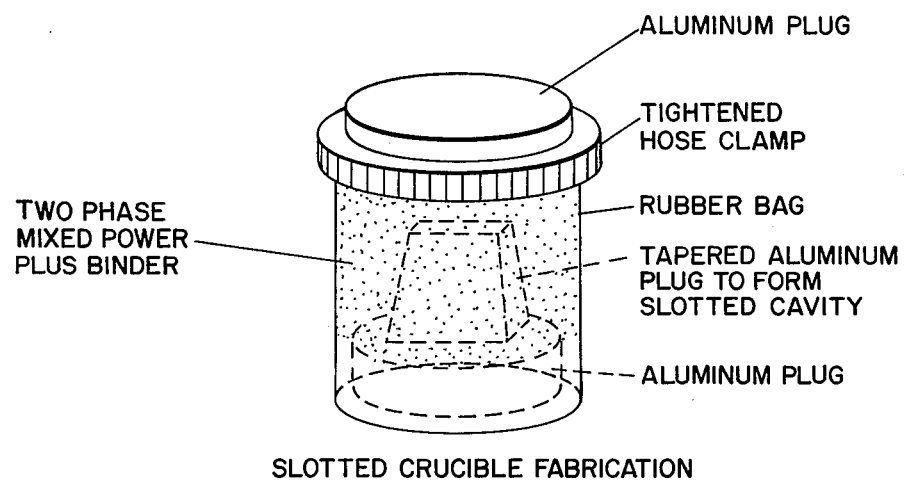
FIGS. 10(a), (b) and (c) are schematic illustrations of slotted crucibles suitable for the vapor phase equilibration of crystalline members.
Figure 10B:
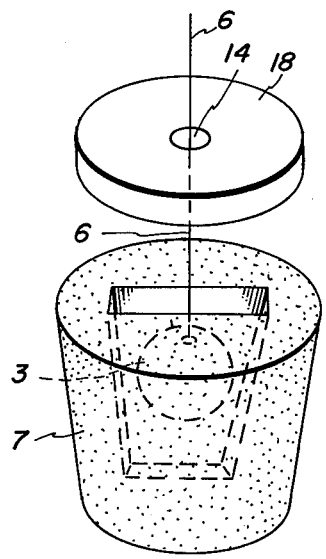
Figure 10C:
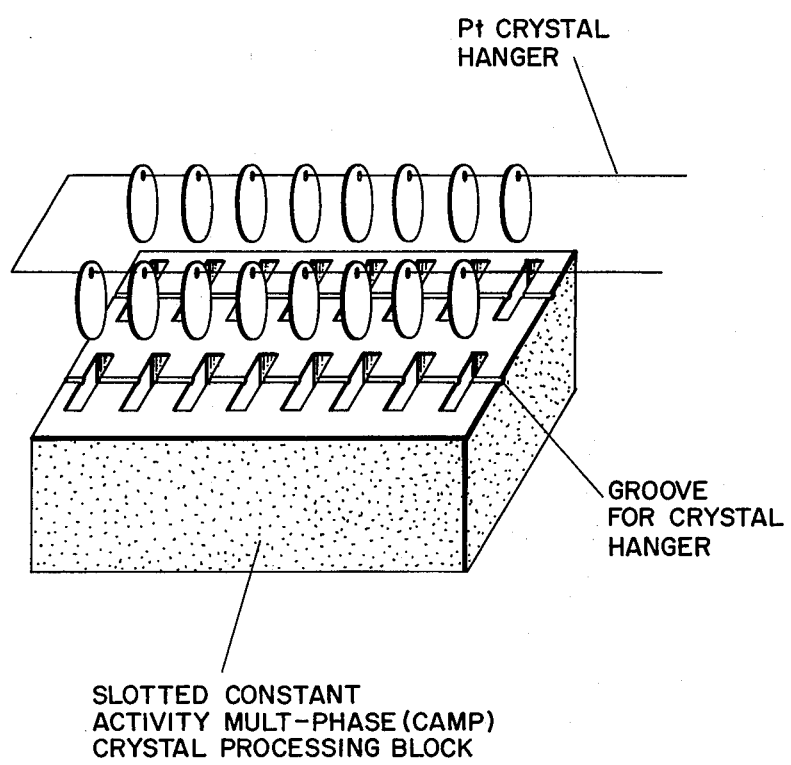

Vapor phase equilibration, in addition to its analytical usefulness can be a practical means by which to standardize and homogenize as-grown lithium niobate single crystals, eliminating the annoying compositional variances, that occur from sample-to-sample, batch-to-batch, and no doubt, from supplier-to-supplier. One or more slices of differing composition and homogeneity can be equilibrated simultaneously within a multi-slotted CAMP crucible, FIG. 10, whose composition determines the final homogenized crystal composition. For example, as grown nonstoichiometric crystals, Table III, can be made stoichiometric by equilibration in CAMP crucible I (LiNbO$_3$ + Li$_3$NbO$_4$), or maximally nonstoichiometric by equilibration in CAMP crucible II (LiNbO$_3$ + LiNb$_3$O$_8$). Homogenization of any intermediate nonstoichiometry is possible as well, as previously indicated.

The phase equilibria, nonstoichiometry, and defect structure of 8/65/35 PLZT has been characterized in detail by Knudsen effusion and serves as a suitable standard for comparison. The total reaction mass-changes, M ($\infty$), for two commerically supplied samples are summarized in Table IV for alternate equilibrations in high and low CAMP crucibles at 1100° C. The mean phase boundary composition, 0.0309$^1$ moles PbO, is in good agreement with the earlier result, 0.0299 moles PbO. The discrepancy, 3.4% is most likely due to a slight temperature error between the two different experiments.

change is approximately a linear function of the log $t/a^2$ for short reaction times ($t < 1$ hour). Subsequent mass changes proceed non-linearly until diffusion is completed and the crystal is in full chemical equilibrium with the atmosphere.

Fabrication of Optical Waveguiding Structures

Single crystal discs of LiNbO$_3$ were heated as described within their low CAMP crucible for times considerably shorter than required for complete equilibration (1 hour and 16 hours at 1100° C). Polycrystalline discs of n/65/35 PLZT ($n$ = 8,9) were at first equilibrated fully in their low CAMP crucible, and then reheated for considerably shorter times (0.5, 0.75 and 1.0 hours at 1050° C) in their high CAMP crucible.

Optical waveguiding layers are formed by solid state diffusion whenever the refractive index is maximized at the surface. Nonstoichiometric solids whose refractive index is altered by a departure from stoichiometry can TABLE IV.
COMPLETE VAPOR PHASE EQUILIBRATION OF HOT-PRESSED POLYCRYSTALLINE
8/65/35 PLZT
CAMP Crucible I : PbO + 8/65/35 PLZT
CAMP Crucible II : 8/65/35 PLZT +ZrO$_2$

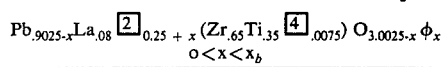

$$Pb_{.9025-x}La_{.08}[2]_{0.25 + x}(Zr_{.65}Ti_{.35}[4]_{.0075})O_{3.0025-x}\phi_x$$
$$o < x < x_b$$

| SAMPLE No. | Weight | MASS-CHANGE, M($\infty$) mgs I | II | I | INITIAL $x_i$ (moles) | BOUNDARY $x_b$ (moles) | TEMPERATURE ° C |
|---|---|---|---|---|---|---|---|
| W6 | .5388$^{71}$ | 6.6$^{64}$ | 11.5$^{61}$ | 11.7$^{43}$ | .0176$^{52}$ | .0308$^6$a | |
| W7 | .4291$^{82}$ | 6.4$^{44}$ | 9.3$^{94}$ | 9.2$^{73}$ | .0213$^{75}$ | .0309$^7$b | 1100° C |
| MASS-LOSS KNUDSEN EFFUSION RESULT$^{24}$ | | | | | | .029$^9$ c | |

NOTES: Standard Deviation
a ± .00033
b ± .00028
c ± .00026

The initial PLZT composition is found to vary significantly from sample-to-sample, indicating the inhomogeneity of the "hot-pressing" process. Vapor phase equilibration can be applied, as discussed for lithium niobate, to standardize and homogenize these sintered samples. Lead oxide-rich 8/65/35 PLZT (minimum nonstoichiometry) can be formed by equilibration in a high CAMP crucible (PbO + 9/65/35 PLZT). Lead oxide deficient 8/65/35 PLZT, (maximum nonstoichiometry) can be formed by equilibration in a low CAMP crucible (8/65/35 PLZT + ZrO$_2$).

Diffusion Data

Vapor phase equilibration, in the limit, has been used to describe phase equilibria and nonstoichiometry. However, its kinetics offer a direct means to characterize vapor/solid equilibria and solid state diffusion. To obtain diffusion data, the same procedure is employed except that complete discs were used and the weight changes are recorded continuously as a function of time.

Figure 11:
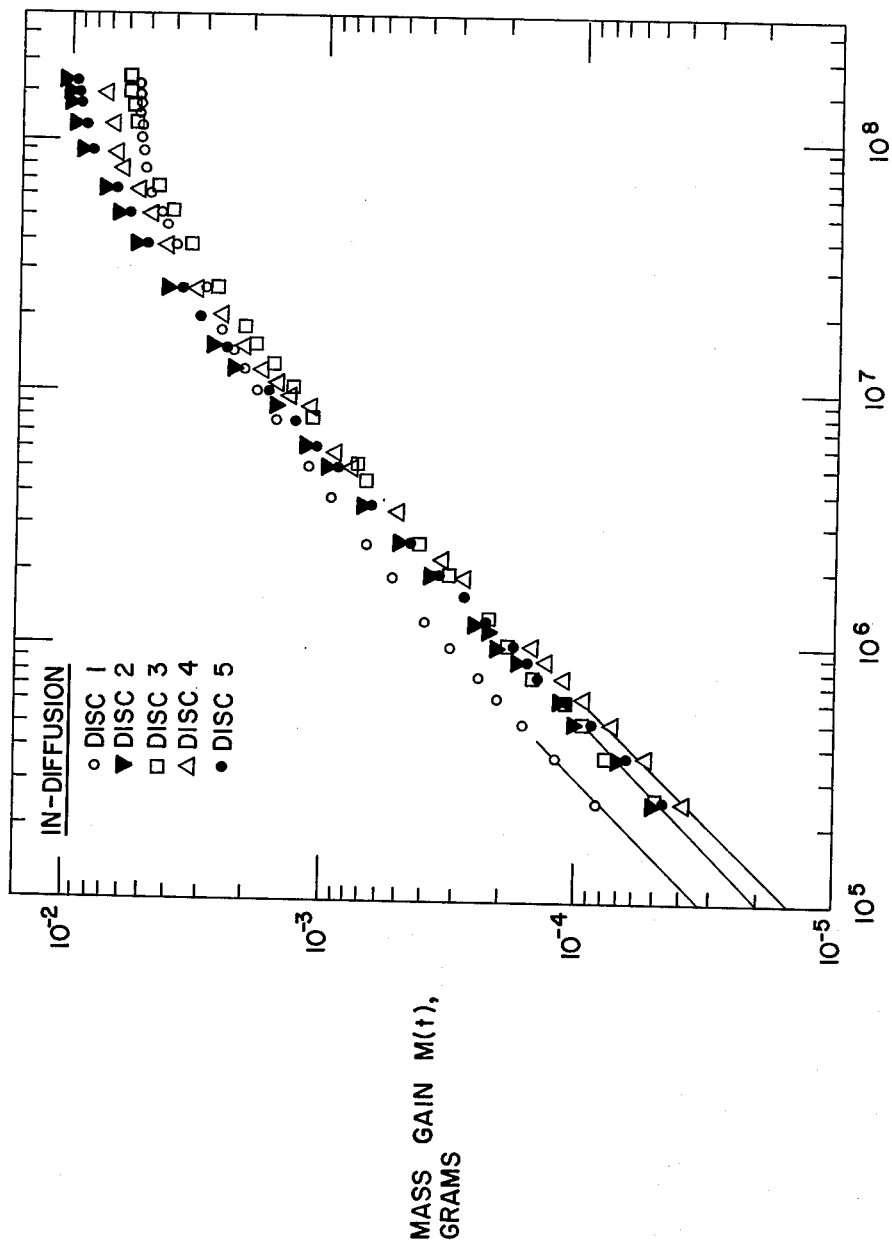
FIG. 11 is a plot reaction mass changes of single crystal LiNbO$_3$ discs as a function of time for in-diffusion.
Figure 12:
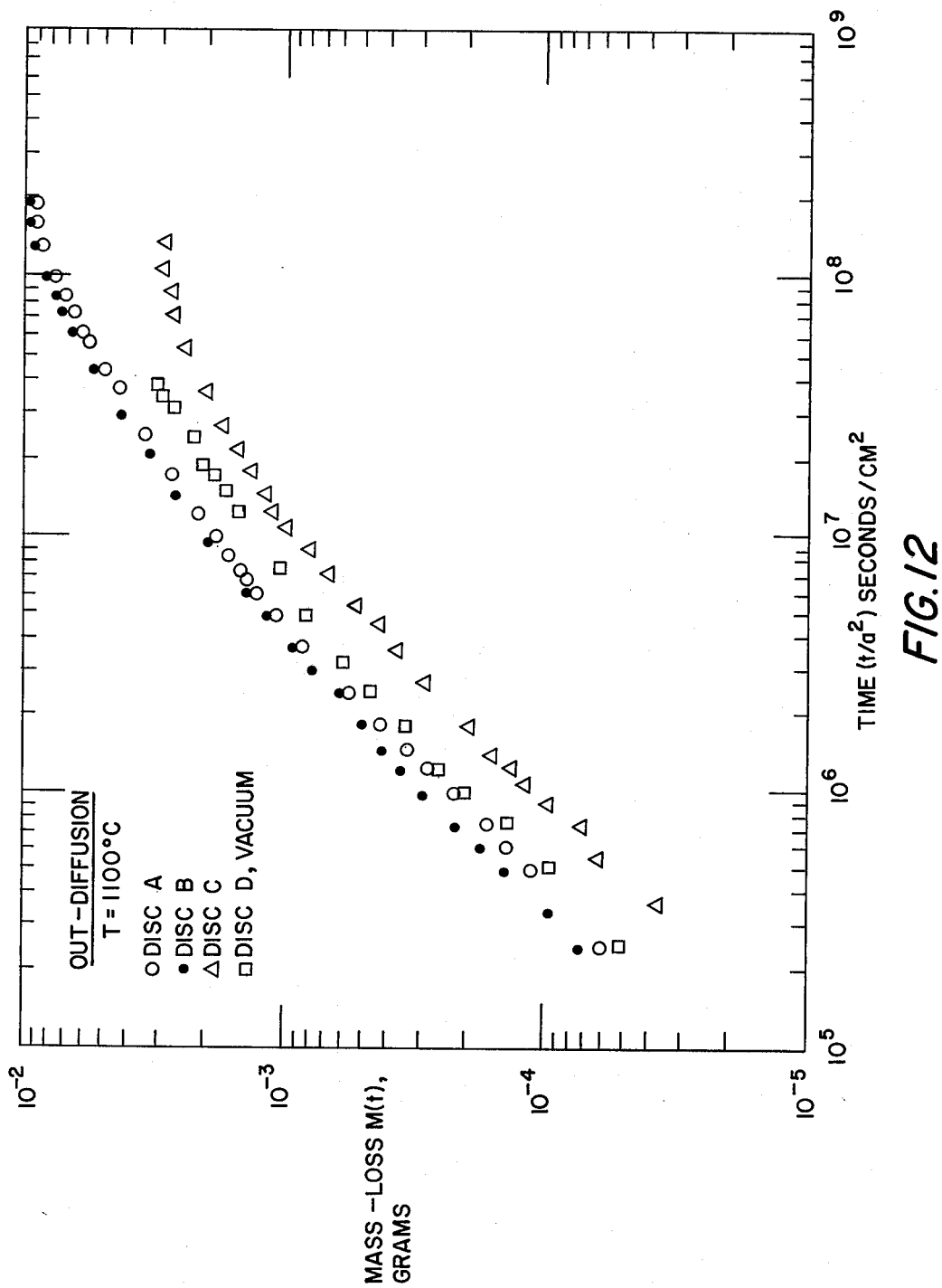
FIG. 12 is a plot of reaction mass-change of single crystal LiNbO$_3$ discs as a function of time for out-diffusion.

The reaction mass-changes at 1100° C of single crystal LiNbO$_3$ discs are summarized as a function of time, $t/a^2$ (seconds/cm$^2$) in FIG. 11 for in-diffusion of Li$_2$O and in FIG. 12 for out-diffusion of Li$_2$O. The mass-changes are plotted logarithmically to facilitate comparison with theoretical models. Specific data points were selected for FIGS. 11 and 12 from the continuous gravimetric data, and were corrected to account for small weight changes of the platinum hang-down wire (1–5$\mu$g/hour).

The general features of the mass-changes kinetics were common to both in- and out-diffusion. Massbe formed as optical waveguides by diffusion under conditions of partial vapor phase equilibration. When the refractive index is increased by deviation from stoichiometry, an optical waveguide is formed by increasing the nonstoichiometry through outdiffusion (LiNbO$_3$). When the refractive index is decreased by deviation from stoichiometry, an optical waveguide is formed by reducing the nonstoichiometry through indiffusion (PLZT).

An optical waveguide is characterized by the nature of its refractive index profile. When solid state diffusion is modeled, such as by gravimetry, and the relationship between refractive index and composition is known, a process can be designed to achieve a particular graded refractive index profile.

Gravimetry affords a direct means of process control, and the method of vapor phase equilibration can be extended to batch processing.

Single Crystal LiNbO$_3$ Waveguides

It is known that the extraordinary refractive index of single crystal LiNbO$_3$ increases as the crystal is grown more deficient with respect to lithium oxide. Kaminow and Carruthers, cited earlier, have reported producing waveguiding layers by removing Li$_2$O from as-grown crystals by vacuum out-diffusion. However, out-diffusion in vacuum provides only limited control of the refractive index profile, is subject to intrinsic formation of second oxide phases at, or near, the surface, and can be quite difficult to control. Moreover, vacuum heating causes a reduction of niobium and transition metal impurities, which has to be reversed by a subsequent anneal in oxygen, possibly altering the diffusion profile.

Figure 13:
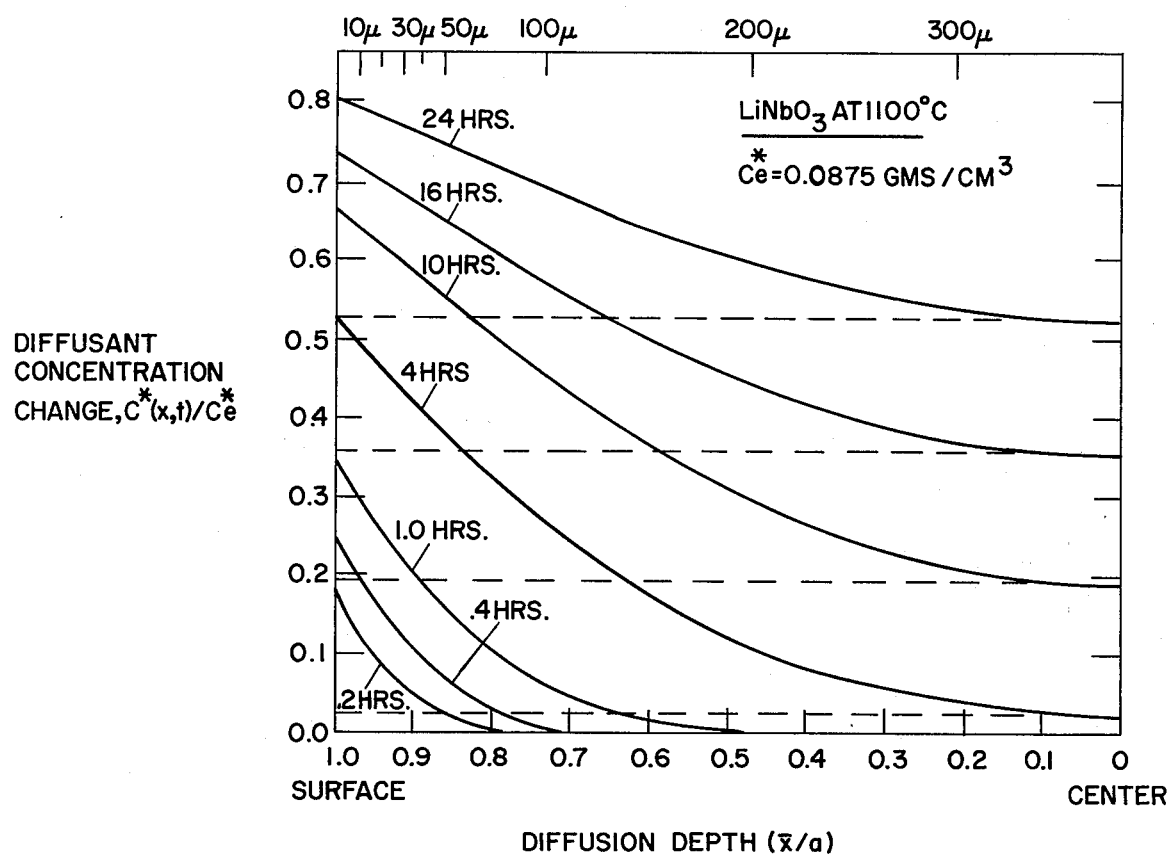
FIG. 13 is a plot of concentration profiles for a typical out-diffused single crystal LiNbO$_3$ disc.

These difficulties were avoided by achieving outdiffusion under the conditions of vapor phase equilibration. The concentration profiles developed within a typical as-grown LiNbO$_3$ disc after partial equilibration times at 1100° C in a low CAMP crucible of 0.2, 0.4, 1, 4, 16 and 24 hours are plotted in FIG. 13. It is noted that for partial equilibration times less than about 4 hours, the concentration in the center of the sheet is unaltered, and both the nonstoichiometry and the depth of diffusion increases with time. Further heating continues to increase the nonstoichiometry at the surface of the sheet, but causes concurrent diffusion of Li$_2$O away from its center. The net effect is to reduce the overall increase in nonstoichiometry, and the depth of diffusion thereby influencing the shape of the concentration profile.

Figure 14:
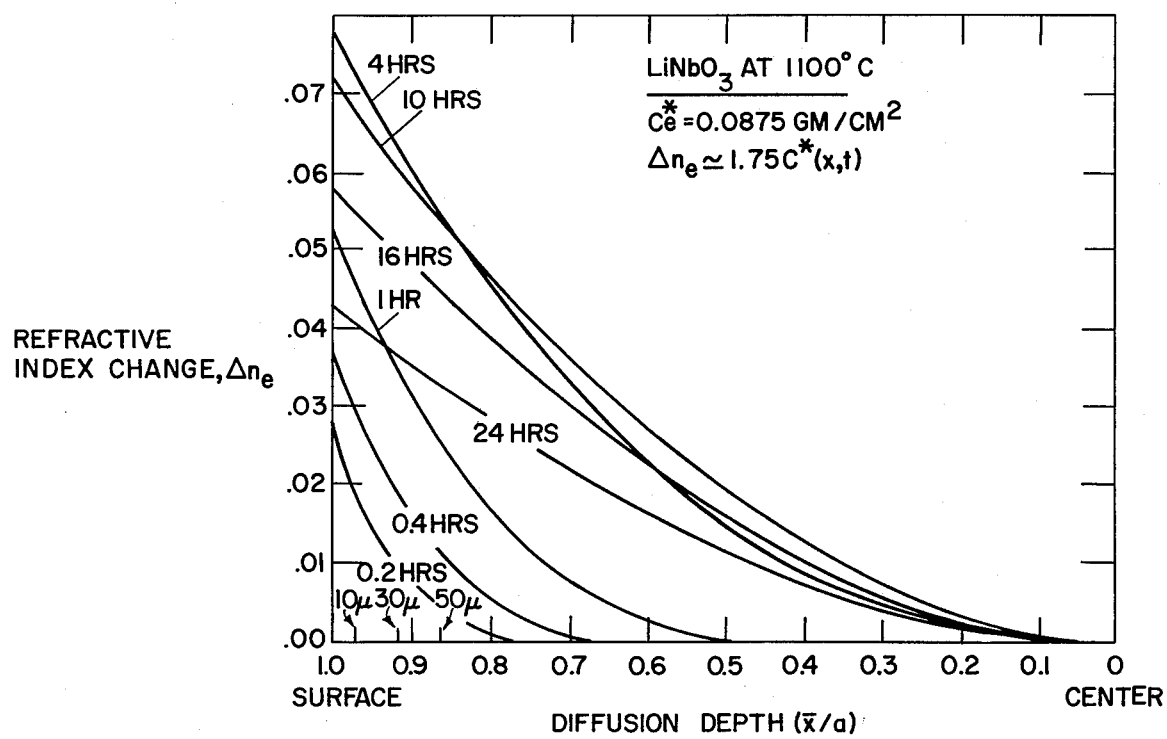
FIG. 14 is a plot of refractive index profiles for a typical out-diffused single crystal LiNbO$_3$ disc.

Concentration can be converted to refractive index as in FIG. 14 by utilizing the approximation, $\Delta n_e = 1.75c^*$. Process reproducibility is effected primarily by the typical variations in crystal composition from slice-to-slice, but can be improved by the simple pre-treatment of complete vapor phase equilibration as discussed earlier.

Optically polished single crystal discs, outdiffused under the conditions of vapor phase equilibration exhibited no measurable degradation in either surface condition or transparency. The crystals did not develop even a slight coloration (as is common in vacuum heating) and, when cooled rapidly, exhibited no detectable phase separation. Furthermore, light microscopy revealed no evidence that heating caused any thermal depoling of the ferroelectric crystal.

Optical waveguiding of coherent red light (6328A) was demonstrated by means of rutile prism coupling, and indicated multi-mode propagation with optical losses below the level of detectibility.

Polycrystalline PLZT Waveguides

The refractive indices of optically transparent polycrystalline PLZT are decreased by the removal of its volatile subcomponent, PbO. Consequently, PbO-rich single phase optical waveguiding layers can be formed in nonstoichiometric PLZT by in-diffusion of PbO under conditions of partial vapor phase equilibration.

This was accomplished by a two step process. First, a polished PLZT disc was out diffused under conditions of complete vapor phase equilibration in its low CAMP crucible to insure sufficient nonstoichiometry. The disc was then re-heated within its high CAMP crucible, for a short time, causing the partial in-diffusion of PbO, and an increased refractive index. Of course, if the PLZT crystalline member has sufficient nonstoichiometry, then only the single step of in-diffusion need to practiced.

PLZT discs treated in this manner exhibited reduced optical transparencies due to thermal etching of the vapor exposed grain boundaries. This condition was minimized by lowering the diffusion temperature and then eliminated entirely, by a light mechanical polish.

It was found that n/65/35 PLZT (n = 8, 9) discs treated accordingly at 1050° C and for diffusion times of 0.5, 0.75 and 1.0 hours, allowed the propagation of both TE and TM modes, implying either or both the ordinary and extraordinary refractive indices were modified by the PbO in-diffusion. The measured refractive index change, 0.12, is equivalent to the highest refractive index change in the literature to date. Electrodes were applied to the PLZT waveguides to achieve optical modulation of coherent red light (6328A) by each of the material's electric field controlled effects, features unique to the polycrystalline morphology.

In addition to the relative fabrication simplicity and a range of properties offered by PLZT, it was observed to have frequency limitations (<1MHz) and moderate optical losses (4–6db/cm at 6328A).

Complete vapor phase equilibration between two solids in accordance with the practice of the present invention provides a method of chemically analyzing non-stoichiometric materials that cannot be assayed accurately by standard means of quantitative analysis and provides a method of standardization which reduces sample-to-sample variances in crystalline materials.

Partial vapor phase equilibration between two solids in accordance with the practice of the present invention provides a method of forming waveguiding layers in transparent crystalline members with controlled magnitude and profile of the refractive index in the waveguiding layer.

Further, either complete or partial vapor phase equilibration between two solids in accordance with the practice of the present invention has been found to provide a method for neutralizing optical induced reversible optical damage, i.e., localized changes in refractive index, in complete inorganic oxides and in crystalline inorganic waveguiding layers.

It has been observed that both the magnitude of, and susceptibility to, optical damage is related to the number of diffusively formed lattice vacancies in a crystal. Specifically, the optically damageability of single phased crystalline lithium niobate materials have been markedly reduced by increasing their number of oxygen vacancies by either complete or partial vapor phase equilibration. In LiNbO$_3$ crystals, diffusively found oxygen vacancies are believed to act as electron trapping sites.

Optical damage has been correlated in the literature with the photogeneration of electrons from impurities such as iron. Increased electron trapping competes with the photogeneration process and thereby reduces the number of photogenerated electrons that are able to contribute to optical damage.

The phrase "mass transport between crystalline solid and solid crucible under vapor phase equilibrium conditions" as used in the claims, refers to the diffusion kinetics occurring in the process of the present invention and is used herein to mean that the following boundary conditions are satisfied: (1) the flux of molecules of the common vapor phase captured by one of the solids from the atmosphere of constant chemical potential is equal to the flux of molecules escaping from that same solid into the atmosphere of constant chemical potential, when that solid is equilibrated with the atmosphere of constant chemical potential; (2) when that solid is not equilibrated with the atmosphere, the chemical potential difference between the atmosphere and the solid causes either a greater number (in-diffusion) or lesser number (out-diffusion) of molecules of the common vapor phase to be captured than released, developing a driving potential for the diffusion of the common vapor phase within the solid either into or out of the solid, as appropriate; and (3) as either in-diffusion or out-diffusion proceeds, the mass gained or lost by the solid is a function of the net flux with respect to the solid of molecules of the common vapor phase and the surface area of the solid.

What is claimed is:

1. A method for altering the stoichiometry of a single phase crystalline solid, comprising:
   a. placing said crystalline solid within a solid crucible having a cavity of pre-determined dimensions such that said crystalline solid is substantially symmetrically separated from the walls of said cavity in said solid crucible by a distance up to about three millimeters, said crucible comprising material which gives off the same chemical metal component in the vapor phase as said crystalline solid at a temperature, T; said chemical component in the vapor phase having a vapor pressure less than about $10^{-4}$ atmosphere at said temperature T; and
   b. isothermally heating said crystalline solid and said solid crucible at said temperature T, to surround said crystalline solid with an atmosphere of substantially constant activity with respect to said chemical component in the vapor phase and within said cavity; said pre-determined dimensions of said cavity being effective to produce mass transport between said crystalline solid and said solid crucible under vapor phase equilibrium conditions.

2. The method of claim 1 further including the step of terminating step (b) prior to complete vapor phase equilibration between said crucible and said crystalline solid, wherein is formed along the surfaces of, and within, said crystalline solid a layer region having an optical index of refraction greater than the optical index of refraction of the remaining bulk of said crystalline solid.

3. The method of claim 1 wherein said single phase crystalline solid is stoichiometric and has an activity at temperature T with respect to said chemical component which is greater than that of said solid crucible to cause out-diffusion of said chemical component at temperature T from said single phase crystalline solid into said atmosphere of substantially constant activity.

4. The method of claim 3 further including the steps, comprising:
   c. placing said crystalline solid within another crucible, said other crucible comprising material which gives off the same chemical component in the vapor phase as said crystalline solid at said temperature T as the crucible used in step (a); said other crucible having an activity at temperature T with respect to said chemical component in the vapor phase which is greater than that of said crystalline solid; and
   d. isothermally heating said crystalline solid and said other solid crucible to surround said crystalline solid with another atmosphere of substantially constant activity with respect to said chemical component in the vapor phase which is greater than that of said crystalline solid; said other crucible having a cavity of dimensions effective to produce diffusion of said chemical component in the vapor phase from said other atmosphere into said crystalline solid under vapor phase equilibrium conditions.

5. The method of claim 1 wherein said crystalline solid has an activity at temperature T with respect to said chemical component which is less than that of said solid crucible, wherein said chemical component is diffused from said atmosphere of substantially constant activity into said crystalline solid.

6. The method of claim 1 further comprising the step of polishing the transparent crystalline member.

7. The method of claim 1 further including the step of weighing said transparent crystalline member during the performance of step (b).

8. The method of claim 1 wherein said crystalline solid comprises lithium niobate and wherein the oxygen vacancies within said crystalline solid are increased in number.

9. A method for forming a waveguiding layer in a transparent crystalline member comprising:
   a. placing said transparent crystalline member in a crucible having a cavity of predetermined dimensions such that said crystalline solid is substantially symmetrically separated from the walls of said cavity in said solid crucible by a distance up to about 3 millimeters comprising material which gives off the same chemical metal component in the vapor phase as said transparent crystalline member at a temperature, T; said chemical component in the vapor phase having a vapor pressure less than about $10^{-4}$ atmosphere at said temperature T; and
   b. isothermally heating said transparent crystalline member and said crucible at said temperature, T, to provide an atmosphere surrounding said transparent sample and of substantially constant activity with respect to said chemical component in the vapor phase, for a period of time sufficient to form along the surface of said transparent crystalline member a layer region thereof having an optical index of refraction greater than the optical index of refraction of the remaining bulk of said transparent crystalline member.

10. The method of claim 9 wherein said step of isothermally heating said transparent crystalline member causes out-diffusion of said chemical component from said transparent crystalline member.

11. The method of claim 10 wherein said transparent crystalline member comprises lithium niobate.

12. The method of claim 11 wherein said crucible comprises a mixture of $LiNbO_3$ and $LiNb_3O_8$.

13. The method of claim 12 wherein said isothermal heating step is carried out at a temperature of about 1100° C.

14. The method of claim 13 wherein said isothermal heating step is carried out for a period of time up to about 4 hours.

15. The method of claim 11 wherein, prior to step (a), the crystalline member comprising lithium niobate and the crucible is treated with isopropyl alcohol and air-dried.

16. The method of claim 9 wherein said step of isothermally heating said transparent crystalline member causes in-diffusion of said chemical component into said transparent crystalline member.

17. The method of claim 16 wherein said transparent crystalline member comprises PLZT.

18. The method of claim 17 wherein said crucible comprises a mixture of PbO and 9/65/35 PLZT.

19. The method of claim 18 wherein said isothermal heating step is carried out at a temperature of about 1050° C.

20. The method of claim 18 wherein, prior to the performance of steps (a) and (b), the transparent crystalline member of PLZT is out diffused to complete vapor phase equilibration at said temperature in a crucible comprising $ZrO_2$ and 8/65/35 PLZT.

* * * * *